United States Patent [19]

Gherardi et al.

[11] Patent Number: 5,444,238

[45] Date of Patent: Aug. 22, 1995

[54] DEVICE FOR ASSESSING THE TRANSMISSION QUALITY OF AN OPTICAL AMPLIFIER EQUIPMENT

[75] Inventors: Bernard Gherardi, Lisses; Gérard Bourret, La Ville Du Bois; Jean-Bernard Leroy, Bu, all of France

[73] Assignee: Alcatel CIT, Paris, France

[21] Appl. No.: 217,057

[22] Filed: Mar. 24, 1994

[30] Foreign Application Priority Data

Mar. 30, 1993 [FR] France .................... 93 03674

[51] Int. Cl.⁶ ............................................. H01J 5/16
[52] U.S. Cl. ................................ 250/227.11; 359/179
[58] Field of Search .................. 250/227.11, 227.17, 250/227.27; 356/73.1; 359/111, 179, 177, 151, 333–349

[56] References Cited

U.S. PATENT DOCUMENTS

| 5,013,907 | 5/1991 | Bateman | 250/227.12 |
| 5,293,545 | 3/1994 | Huber | 359/111 |
| 5,299,048 | 3/1994 | Suyama | 359/179 |

FOREIGN PATENT DOCUMENTS

046445A1  1/1992  European Pat. Off. .
2207827   2/1989  United Kingdom .

OTHER PUBLICATIONS

Starvos Iezekiel et al, "Scattering Parameter Characterization of Microwave Optoelectronic Devices and Fiber-Optic Networks", *IEEE Microwave and Guided Wave Letters*, vol. 1, No. 9, Sep. 1991, pp. 233–235.

French Search Report FR 9303674.

*Primary Examiner*—David C. Nelms
*Assistant Examiner*—Que T. Le
*Attorney, Agent, or Firm*—Sughrue, Mion, Zinn, Macpeak & Seas

[57] ABSTRACT

A device for assessing the transmission quality of an optical amplifier includes a coupler for sampling on the upstream side of the amplifier equipment relative to the direction of propagation of the optical signal to be amplified by the amplifier equipment part of the power of an optical signal propagating in the direction opposite to the propagation direction and corresponding to that part of the noise generated by the amplifier equipment transmitted in the direction opposite to the propagation direction. It also includes a coupler for sampling on the downstream side of the amplifier equipment relative to the propagation direction part of the power of an optical signal propagating in the propagation direction and corresponding to the optical signal after amplification by the amplifier equipment superimposed on that part of the noise generated by the amplifier equipment and transmitted in the propagation direction. It assesses the signal-to-noise ratio of the amplifier equipment from the optical powers sampled as above.

4 Claims, 1 Drawing Sheet

DEVICE FOR ASSESSING THE TRANSMISSION QUALITY OF AN OPTICAL AMPLIFIER EQUIPMENT

BACKGROUND OF THE INVENTION

1. Field of the Invention

The present invention is generally concerned with the reliability of information transmission links and more particularly a device for assessing the transmission quality of a transmission optical amplifier equipment used on an optical transmission link, such assessment being carried out, among other things, to enable activation of a mechanism for re-establishing the transmission quality of the link in the event of deterioration of the transmission quality of the amplifier equipment.

The amplifier equipments may be intermediate amplifier equipments or repeaters disposed at regular intervals along a link and amplifying the signals conveying said information in order to compensate the attenuation resulting from their transmission on the link.

2. Description of the Prior Art

In the case of optical links and in the more particular case of transmission of digital information on an optical link intermediate equipments called regenerators are used to process the signals obtained after optical-to-electrical conversion of the transmission signals transmitted on the link, the regenerator equipments not only amplifying the resulting electrical signals but also re-constituting them as faithfully as possible, given the digital nature of the information.

A known method for assessing the transmission quality of regenerator equipments is to include a parity binary digit in the code used to transmit the information and to measure the error rate affecting said electrical signals in the regenerator equipment.

Since the invention of optical amplifiers such as doped fiber optical amplifiers and semiconductor optical amplifiers, for example, which are able to amplify optical signals directly, it has been possible to use these amplifiers as intermediate amplifier equipments on an optical link. These amplifiers can also be used as amplifier equipments at the ends of a link, to obtain a sufficient transmit and/or receive level.

SUMMARY OF THE INVENTION

The present invention consists in a device for assessing the transmission quality of optical amplifier equipments of this kind.

The present invention consists in a device for assessing the transmission quality of an optical amplifier equipment essentially characterized in that it comprises:
- means for sampling on the upstream side of said amplifier equipment relative to the direction of propagation of the optical signal to be amplified by said amplifier equipment part of the power of an optical signal propagating in the direction opposite to said propagation direction and corresponding to that part of the noise generated by said amplifier equipment transmitted in the direction opposite to said propagation direction,
- means for sampling on the downstream side of said amplifier equipment relative to said propagation direction part of the power of an optical signal propagating in said propagation direction and corresponding to the optical signal after amplification by said amplifier equipment superimposed on that part of the noise generated by said amplifier equipment and transmitted in said propagation direction, and
- means for assessing the signal-to-noise ratio of said amplifier equipment from the optical powers sampled as above.

BRIEF DESCRIPTION OF THE DRAWING

Other objects and features of the invention emerge from the following description of one embodiment of the invention given with reference to the appended drawing which is a block schematic of one embodiment of a device according to the invention.

DETAILED DESCRIPTION OF THE PREFERRED EMBODIMENT

Figure 1:
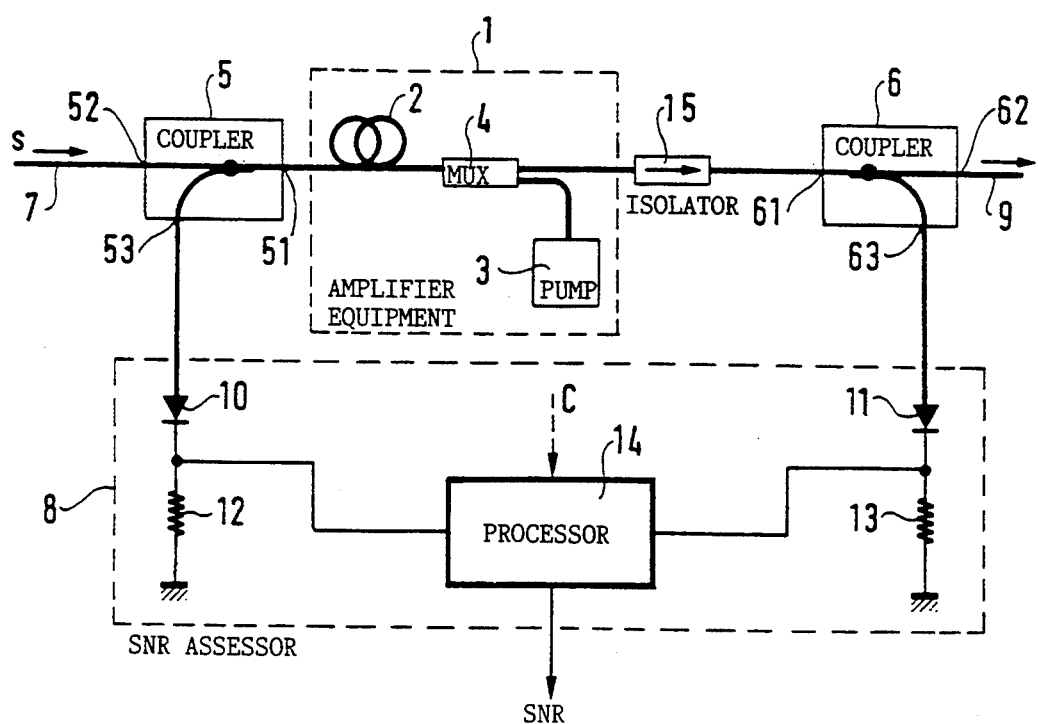

The transmission quality assessment device shown in the figure is designed to assess the transmission quality of an amplifier equipment 1 used as repeater equipment on an optical transmission link, for example.

In this example the amplifier equipment includes a portion 2 of optical fiber doped with ions of a rare earth such as erbium, for example, and a pump optical source 3 supplying a pump optical signal enabling said doped fiber portion to behave as an optical amplifier and fixing the gain of this optical amplifier. For an erbium doped fiber portion the wavelength of the pump optical signal is equal to 1.48 $\mu$m or 0.98 $\mu$m, for example. The pump signal is multiplexed with the incoming optical signal to be amplified by said amplifier equipment and is conveyed by an optical carrier at a wavelength equal to 1.55 $\mu$m, for example, in a wavelength multiplexer 4 at the downstream end of the doped fiber portion ("downstream" in relation to the direction of propagation of the incoming optical signal to be amplified, as shown by an arrow directed from left to right in this example).

Although it amplifies the incoming optical signal "s", the amplifier equipment 1 is a source of noise and the signal-to-noise ratio at the output of the amplifier equipment is characteristic of the transmission quality of the amplifier equipment, deterioration of the signal-to-noise ratio indicating deterioration of this transmission quality.

In the present example of a doped fiber optical amplifier equipment, this noise essentially originates through the phenomenon known as amplified spontaneous emission (ASE).

To assess the signal-to-noise ratio the present invention exploits the property of this noise generated by the amplifier equipment of being transmitted partly in one direction and partly in the other, i.e. partly towards the upstream end and partly towards the downstream end of the doped fiber portion (relative to the direction of propagation of the incoming optical signal to be amplified).

The device according to the invention includes two optical couplers, namely an optical coupler 5 at the upstream end of said doped fiber portion for sampling a fraction of the power of an optical signal propagating in the opposite direction to said propagation direction and corresponding to the part of the noise generated by the amplifier equipment transmitted towards said upstream end and an optical coupler 6 at the downstream end of said doped fiber portion and adapted to sample a fraction of the power of an optical signal propagating in said propagation direction and consisting of the incoming optical signal after amplification by the amplifier equipment superimposed on that part of the noise generated by the amplifier equipment transmitted towards said downstream end.

In more detail, the coupler 5 is a four-port coupler of which three ports are used in this example. One port 51 is coupled to the upstream end of said doped fiber portion, another port 52 is coupled to an optical fiber 7 conveying the incoming optical signal to be amplified and another port 53 is coupled to means 8 for assessing the signal-to-noise ratio.

Similarly, the coupler 6 is a four-port coupler of which three ports are used in this example. A port 61 is coupled to the downstream end of said doped fiber portion via an isolator 15 which blocks transmission in the direction from the port 61 to the doped fiber portion. Another port 62 is coupled to an optical fiber 9 conveying the optical signal obtained at the output of the amplifier equipment. Another port 63 is coupled to said means for assessing the signal-to-noise ratio.

The couplers 5 and 6 advantageously have the same coupling factor in order to simplify said assessment of the signal-to-noise ratio.

For example, said means for assessing the signal-to-noise ratio operate on electrical signals obtained at the output of optical-to-electrical conversion means operating on the optical signals obtained at said ports 53 and 63. These optical-to-electrical conversion means include, for example, associated with each of said couplers, a respective photodetector 10, 11 coupled to the respective port of the coupler and producing an electrical current proportional to the mean optical power received at this port and a respective resistor 12, 13 producing a voltage proportional to this current.

Said assessment of the signal-to-noise ratio SNR can be effected as shown in the diagram by processing means 14 operating on said voltages in this example.

The processing carried out by said processing means 14 may need to take account of characteristics inherent to the amplifier equipment (concerning both its components and the conditions under which it is used) in order to determine the relationship between the respective parts of the noise generated by the amplifier equipment transmitted in said propagation direction and in the direction opposite to said propagation direction, in order to determine the signal-to-noise ratio subsequently by means that can be conventional and so need not be described here. Said characteristics inherent to the amplifier equipment are indicated by the dashed line arrow C in the diagram to show this facility.

If it is necessary to detect only deterioration with time in the transmission quality of the amplifier equipment it may not be necessary to allow for these characteristics in said assessment of the signal-to-noise ratio.

The signal-to-noise ratio can be assessed either locally, i.e. at the amplifier equipment concerned (as shown in the drawing), or in a terminal equipment of said link if signals corresponding to said voltages are transmitted to the terminal equipment (possibly on the same link and possibly after conversion to digital form). If the signal-to-noise ratio is assessed locally, and if the link is supervised from a terminal equipment, the result of the assessment must be transmitted to this terminal equipment.

If the same link includes a plurality of amplifier equipments, an optical isolator 15 is advantageously provided to prevent propagation to the amplifier equipment in question of noise generated by the amplifier equipments on the downstream side of this amplifier equipment relative to the propagation direction of the optical signal to be amplified.

There is claimed:

1. Device for assessing the transmission quality of an optical amplifier equipment, comprising:

first means for sampling, on the upstream side of said amplifier equipment relative to the direction of propagation of the optical signal to be amplified by said amplifier equipment, part of the power of an optical noise signal, said part, propagating in the direction opposite to said propagation direction and corresponding to that part of the noise generated by said amplifier equipment transmitted in the direction opposite to the propagation direction of the optical signal to be amplified;

second means for sampling, on the downstream side of said amplifier equipment, part of the power of an optical signal comprising an amplified signal and a noise signal propagating in the propagation direction of the optical signal to be amplified, and corresponding to the optical signal after amplification by said amplifier equipment, superimposed on a part of the noise generated by said amplifier equipment, and means for assessing the signal-to-noise ratio of said amplifier equipment from the optical powers sampled as above.

2. Device according to claim 1 wherein said means for assessing the signal-to-noise ratio allow for characteristics inherent to said amplifier equipment and enabling a relationship to be established between said parts of the noise generated by said amplifier equipment transmitted in the propagation direction of the signal to be amplified and in the opposite direction.

3. Device according to claim 1 wherein said means for assessing the signal-to-noise ratio include:

means for converting into electrical signals the optical signals respectively sampled by said first and second sampling means, and means for assessing the signal-to-noise ratio operating on the resulting electrical signals.

4. Device according to claim 3 wherein said means for assessing the signal-to-noise ratio allow for said characteristics inherent to said amplifier equipment.

* * * * *